United States Patent
Ben-David et al.

(10) Patent No.: US 6,665,848 B2
(45) Date of Patent: Dec. 16, 2003

(54) TIME-MEMORY TRADEOFF CONTROL IN COUNTEREXAMPLE PRODUCTION

(75) Inventors: Shoham Ben-David, Haifa (IL); Leonid Glukhovsky, Haifa (IL)

(73) Assignee: International Business Machines Corporation, Armonk, NY (US)

( * ) Notice: Subject to any disclaimer, the term of this patent is extended or adjusted under 35 U.S.C. 154(b) by 109 days.

(21) Appl. No.: 10/042,293

(22) Filed: Jan. 11, 2002

(65) Prior Publication Data

US 2002/0178423 A1 Nov. 28, 2002

Related U.S. Application Data

(60) Provisional application No. 60/261,550, filed on Jan. 12, 2001.

(51) Int. Cl.[7] ............ G06F 17/50; G06F 19/00
(52) U.S. Cl. ............ 716/5; 716/3; 716/7; 716/18; 703/2; 703/16; 703/17; 703/28; 714/45
(58) Field of Search ............ 716/3, 5, 7, 18; 703/2, 16, 17, 28; 714/45

(56) References Cited

U.S. PATENT DOCUMENTS

| | | | | |
|---|---|---|---|---|
| 5,331,568 | A | * 7/1994 | Pixley | 716/3 |
| 6,061,511 | A | * 5/2000 | Marantz et al. | 703/28 |
| 6,292,765 | B1 | * 9/2001 | Ho et al. | 703/14 |
| 6,367,060 | B1 | * 4/2002 | Cheng et al. | 716/10 |

OTHER PUBLICATIONS

Florin et al., "Searching best paths to worst states", Proceedings of the Fourth International Workshop on Petri Nets and Performance Models, Dec. 02, 1991, pp. 204–209.*
Bose et al., "Deriving logic systems for path delay test generation", IEEE Transactions on Computers, vol. 47, No. 8, Aug. 1998, pp. 829–846.*
NN7607694, "General Purpose Interactive System Evaluation Tool", IBM Technical Disclosure Bulletin, vol. 19, No. 2, Jul. 1976, pp. 694–695 (6 pages).*
NN83102510, "Constrained Channel Coding With Spectral Null", IBM Technical Disclosure Bulletin, vol. 26, No. 5, Oct. 1983, pp. 2510–2514 (9 pages).*
U.S. patent application Ser. No. 09/362,720, entitled "Target Design Model Behavior Explorer", filed Jul. 29, 1999.
U.S. Provisional patent application Ser. No. 60/261,550, entitled "PathFinder: Design Exploration Through Model Checking", filed Jan. 12, 2001.
Clarke Jr. et al., "Model Checking", Chapter 1, MIT Press, 1999, pp. 4–6.
K. McMillan, "Model Checking", Kluwer Academic Publishers, Chapter 2, pp. 11–12, 1993, Norwell, Massachusetts.
E.M. Clarke et al., "Efficient Generation of Counterexamples and Witness in Symbolic Model Checking", $32^{nd}$ Design Automation Conference, 1995, pp. 427–432.

(List continued on next page.)

*Primary Examiner*—Matthew Smith
*Assistant Examiner*—Phallaka Kik
(74) *Attorney, Agent, or Firm*—Browdy and Neimark, P.L.L.C.

(57) ABSTRACT

A method for checking a model includes computing a succession of sets of the states of the system, beginning with an initial set of one or more initial states, such that the states in each of the sets are reachable by a successive cycle of a transition relation of the system from the states in a preceding set. One or more of the sets in the succession are selected to be saved in a memory, while the sets not selected are discarded. When an intersection is found between one of the sets in the succession and a target set, a trace is computed from one of the target states in the intersection through the states in the sets in the succession, including the discarded sets, to one of the initial states, using the sets saved in the memory to reconstruct the discarded sets.

36 Claims, 4 Drawing Sheets

OTHER PUBLICATIONS

Beer et al., "RuleBase: An Industry–Oriented Formal Verification Tool", Proceedings of the Design Automation Conference DAC'96, Las Vegas, Nevada, 1996, Jun. 3, 1996, pp. 655–660.

Beer et al., "On–the–fly Model Checking of RCTL Formulas", Proceedings of the Tenth International Conference on Computer Aided Verification (CAV 1998), 1998, 12 pages.

Beer et al., "The Temporal Logic Sugar", Proceedings of the Thirteenth International Conference on Computer Aided Verification (CAV 2001), pp. 1,3,5,7,9,11,13.

Bryant, "Graph–Based Algorithms for Boolean Function Manipulation", IEEE Transactions on Computers, vol. C–35, No. 8, Aug. 1986, pp. 577–691.

* cited by examiner

TIME-MEMORY TRADEOFF CONTROL IN COUNTEREXAMPLE PRODUCTION

CROSS-REFERENCE TO RELATED APPLICATIONS

This application claims the benefit of U.S. Provisional Patent Application No. 60/261,550, filed Jan. 12, 2001. It is related to U.S. patent application Ser. No. 09/362,720, filed Jul. 29, 1999, as well as to another U.S. patent application Ser. No. 10/042,304, filed on even date, entitled "Efficient Production of Disjoint Multiple Traces," now U.S. Patent Publication No. 2002/0193974-A1. All of these related applications are assigned to the assignee of the present patent application and are incorporated herein by reference.

FIELD OF THE INVENTION

The present invention relates generally to design automation and verification, and specifically to producing counterexamples in symbolic model checking.

BACKGROUND OF THE INVENTION

Model checking is a method of formal verification that is gaining in popularity as a tool for use in designing complex systems, such as integrated circuits. The method is described generally by Clarke et al. in *Model Checking* (MIT Press, 1999), which is incorporated herein by reference.

To perform model checking of the design of a device, a user reads the definition and functional specifications of the device and then, based on this information, writes a set of properties $\{\phi\}$ (also known as a specification) that the design is expected to fulfill. The properties are written in a suitable specification language for expressing temporal logic relationships between the inputs and outputs of the device. Such languages are commonly based on Computation Tree Logic (CTL). A hardware model M (also known as an implementation) of the design, which is typically written in a hardware description language, such as VHDL or Verilog, is then tested to ascertain that the model satisfies all of the properties in the set, i.e., that $M \models \phi$, under all relevant input sequences.

One of the most useful features of model checking is its ability, when a property $\phi$ is found to be false on M, to construct a sequence of states and transitions (a path) that leads to the problematic state of the design. This path is called a counterexample. It can be used by the engineer in understanding and remedying the design defect that led to the failure of the model.

Model checking is preferably carried out automatically by a symbolic model checking program, such as SMV, as described, for example, by McMillan in *Symbolic Model Checking* (Kluwer Academic Publishers, 1993), which is incorporated herein by reference. A number of practical model checking tools are available, among them RuleBase, developed by IBM Corporation. This tool is described by Beer et al. in "RuleBase: an Industry-Oriented Formal Verification Tool," in *Proceedings of the Design Automation Conference DAC'96* (Las Vegas, Nev., 1996), which is incorporated herein by reference.

Symbolic CTL model checking, as described by McMillan, involves computing the transition-relation (TR) of the model, and then applying the model checking algorithm to verify a given formula. In many cases, the full TR is too big to be computed. This problem is addressed by Beer et al., in "On-the-fly Model Checking of RCTL Formulas," *Proceedings of the Tenth International Conference on Computer Aided Verification* (CAV 1998), which is incorporated here in by reference. In this paper, the authors describe a technique for solving CTL formulas of the form AG(p) on the fly, wherein p is a Boolean expression. On-the-fly model checking effectively partitions the TR in such a way as to eliminate the large expenditure of computation resources needed to compute the full TR.

An AG(p) formula states that p is true in every reachable state of the model. Therefore, to disprove this formula, it is sufficient to find one "bad" state in which p is false. On-the-fly model checking is based on the realization that if S is the set of states in which p is false, then in order to find a bad state, it is necessary only to intersect S with the set of reachable states R, and check that the intersection is not empty. Finding this intersection is computationally easy. It can therefore can be performed on the fly, i.e., after each iteration of a reachability analysis used to find R, rather than waiting until the entire extent of R has been determined. If the intersection of S and R is found at any point to be non-empty, the iterations are stopped, and AG(p) is false. A counterexample is then produced by tracing backward from the intersection region, through the states found in the iterations of the reachability analysis, back to one of the initial states. As long as no intersection is found, the process continues until the entire reachable state space has been computed, so that AG(p) is shown to be true. Thus, there is no need to compute the full transition relation. Furthermore, since counterexamples are produced on the fly, only a portion of the reachable state space must be computed when the formula fails, saving even more time and memory space.

In the above-mentioned article, Beer et al. also define a specification language RCTL, as an extension to the conventional CTL language using regular expressions, which makes it possible to translate many CTL formulas conveniently into state machines having an error state. Such formulas can then be verified by on-the-fly model checking of the formula AG(¬error). More recently, Beer et al. have extended RCTL to include further expressions and syntax that are useful in creating formulas for on-the-fly model checking, as described in "The Temporal Logic Sugar," *Proceedings of the Thirteenth International Conference on Computer Aided Verification* (CAV 2001), which is incorporated here in by reference.

SUMMARY OF THE INVENTION

Typically, the most time-consuming step in the process of on-the-fly model checking is computing the next set of states at each iteration of the reachability analysis. (These sets can be seen as a set of concentric rings in state space, and are therefore referred to as "donuts.") It is desirable to save these donuts for reuse in producing a counterexample trace in case the tested formula is found to be false, in order to avoid having to compute all the donuts twice. Saving all the donuts for such reuse can work well for small-size models.

For model checking of large designs, however, the demand on computer resources involved in saving and maintaining all the donuts is so great that it can cause memory explosion and slow the progress of the model checker to a near standstill. As a result, model checking runs in which the tested formula is found to be true (so that no counterexample exists) are typically completed much faster when the donuts found in the reachability analysis are not saved. When the tested formula is found to be false, however, all the donuts must be recomputed in order to produce a counterexample. This recomputation is a major waste of time and effort. Therefore, neither the approach of saving all the donuts during the reachability analysis nor that of discarding all of them makes optimal use of model checker resources.

In response to this difficulty, preferred embodiments of the present invention provide a method for controlling the amount of memory used to store the donuts during the reachability analysis, so that the model checker runs at optimal speed even on very large models. In these preferred embodiments, a subset of the donuts found in the reachability analysis is saved, while the remaining donuts, between the donuts that are selected to be saved, are discarded. Preferably, a donut is saved once in every n iterations of the reachability analysis, wherein n is an adjustable parameter. When the tested formula is found to be false, and a counterexample must be produced, the saved donuts are used in reconstructing the donuts between them that were previously discarded.

The reconstruction of the donuts and tracing of the counterexample are preferably carried out piece by piece. This process begins with the group of donuts between the last donut that was saved and the final donut, which was found to intersect the target states, and then works backward toward the initial states. After each piece of the counterexample has been traced, the donuts used in producing that piece are discarded, and the next group of donuts is reconstructed. In this manner, memory explosion is avoided, by trading off memory consumption against the added computational burden of recomputing the discarded donuts. The optimal size for n is determined heuristically, based on the size of the design under test and the number of iterations of the transition relation to be used in the reachability analysis, as against the available resources of the model checker.

The methods of the present invention can be used advantageously to find not just a single counterexample trace, but also multiple traces, as described in the above-mentioned U.S. patent application entitled, "Efficient Production of Disjoint Multiple Traces." Furthermore, these methods can be used not only for design verification, to find traces leading to bad states of the system, but also for design exploration, as described in the above-mentioned U.S. patent application Ser. No. 08/362,720.

There is therefore provided, in accordance with a preferred embodiment of the present invention, a method for checking a model, which defines states of a system under study and a transition relation among the states, the method including:

specifying a property that applies to a target set that includes one or more target states among the states of the system under study;

beginning with an initial set of one or more initial states among the states of the system, computing a succession of sets of the states of the system, such that the states in each of the sets are reachable by a successive cycle of the transition relation from the states in a preceding set in the succession;

selecting one or more of the sets in the succession to be saved in a memory, while the sets not selected are discarded;

finding an intersection between one of the sets in the succession and the target set; and computing a trace from one of the target states in the intersection through the states in the sets in the succession, including the discarded sets, to one of the initial states, using the sets saved in the memory to reconstruct the discarded sets.

Preferably, computing the succession of sets includes determining a first set among the sets in the succession, disjoint from the initial set, such that all of the states in the first set are reached from the initial states in a first cycle of the transition relation, and determining the sets in the succession following the first set, such that all the states in each of the sets are reached from the states in the preceding set in the successive cycle of the transition relation, and so that each of the sets in the succession is disjoint from the initial set and from the other sets determined before it. Typically, computing the trace includes selecting one of the states from each of the successive sets. Most preferably, selecting the one of the states includes, for each of the selected states, choosing a predecessor state among the states in the preceding set until the state on the trace in the first set is found, and choosing the predecessor state in the initial set to the state in the first set.

In a preferred embodiment, selecting the one or more of the sets to be saved includes saving one of the sets in every N sets that are computed in the succession, wherein N is an integer parameter greater than one, and discarding the sets intermediate the saved sets.

Preferably, computing the trace includes:

reconstructing a first group of the discarded sets between an intermediate set among the selected sets and the intersection;

computing a first portion of the trace through the first group of the reconstructed sets;

discarding the first group of the reconstructed sets from the memory;

reconstructing a second group of the discarded sets preceding the intermediate set in the succession;

computing a second portion of the trace through the second group of the reconstructed sets; and appending the portions of the trace together so as to complete the trace.

Most preferably, reconstructing the first group includes computing the sets in the first group by repeating the step of computing the succession of the sets, starting from the intermediate set. Typically, the second group of the discarded sets includes the discarded sets between a further set among the selected sets, prior to the intermediate set in the succession, and reconstructing the second group includes reconstructing the discarded sets between the further set and the intermediate set in the succession, and the method preferably includes repeating the steps of discarding the reconstructed sets, reconstructing the discarded sets and computing and appending the portions of the trace until the trace reaches one of the initial states.

In a preferred embodiment, specifying the property includes specifying a condition that is expected to be true over all of the reachable states of the system under study, wherein the condition is false in the at least one target state. In another preferred embodiment, specifying the property includes specifying a condition representing a desired behavior of the system under study, such that the condition is fulfilled in the at least one target state.

Preferably, computing the successive reachable sets includes testing the property while computing the sets, and ceasing to compute the sets when the intersection is found. Further preferably, computing the trace includes finding a counterexample to the specified property.

There is also provided, in accordance with a preferred embodiment of the present invention, apparatus for checking a model, which defines states of a system under study and a transition relation among the states, the apparatus including:

a memory, arranged to store data; and a model processor, which is arranged to receive a property that applies to a target set that includes one or more target states among the states of the system under study, and to compute, beginning with an initial set of one or more initial states among the states of the system, a succession of sets of the states of the system, such that the states in each of the sets are reachable by a successive cycle of the transition relation from the states in a preceding set in the succession, such that while computing the sets, the processor selects one or more of the sets in the succession to be saved in the memory, while the sets not selected are discarded, the processor being further arranged to find an intersection between one of the sets in the succession and the target set, and to compute a trace from one of the target states in the intersection through the states in the sets in the succession, including the discarded sets, to one of the initial states, using the sets saved in the memory to reconstruct the discarded sets.

There is additionally provided, in accordance with a preferred embodiment of the present invention, a computer software product for checking a model, which defines states of a system under study and a transition relation among the states, the product including a computer-readable medium in which program instructions are stored, which instructions, when read by a computer, cause the computer to receive a property that applies to a target set that includes one or more target states among the states of the system under study, and to compute, beginning with an initial set of one or more initial states among the states of the system, a succession of sets of the states of the system, such that the states in each of the sets are reachable by a successive cycle of the transition relation from the states in a preceding set in the succession, such that while computing the sets, the computer selects one or more of the sets in the succession to be saved in the memory, while the sets not selected are discarded, the instructions further causing the computer to find an intersection between one of the sets in the succession and the target set, and to compute a trace from one of the target states in the intersection through the states in the sets in the succession, including the discarded sets, to one of the initial states, using the sets saved in the memory to reconstruct the discarded sets.

The present invention will be more fully understood from the following detailed description of the preferred embodiments thereof, taken together with the drawings in which:

DETAILED DESCRIPTION OF PREFERRED EMBODIMENTS

Figure 1:
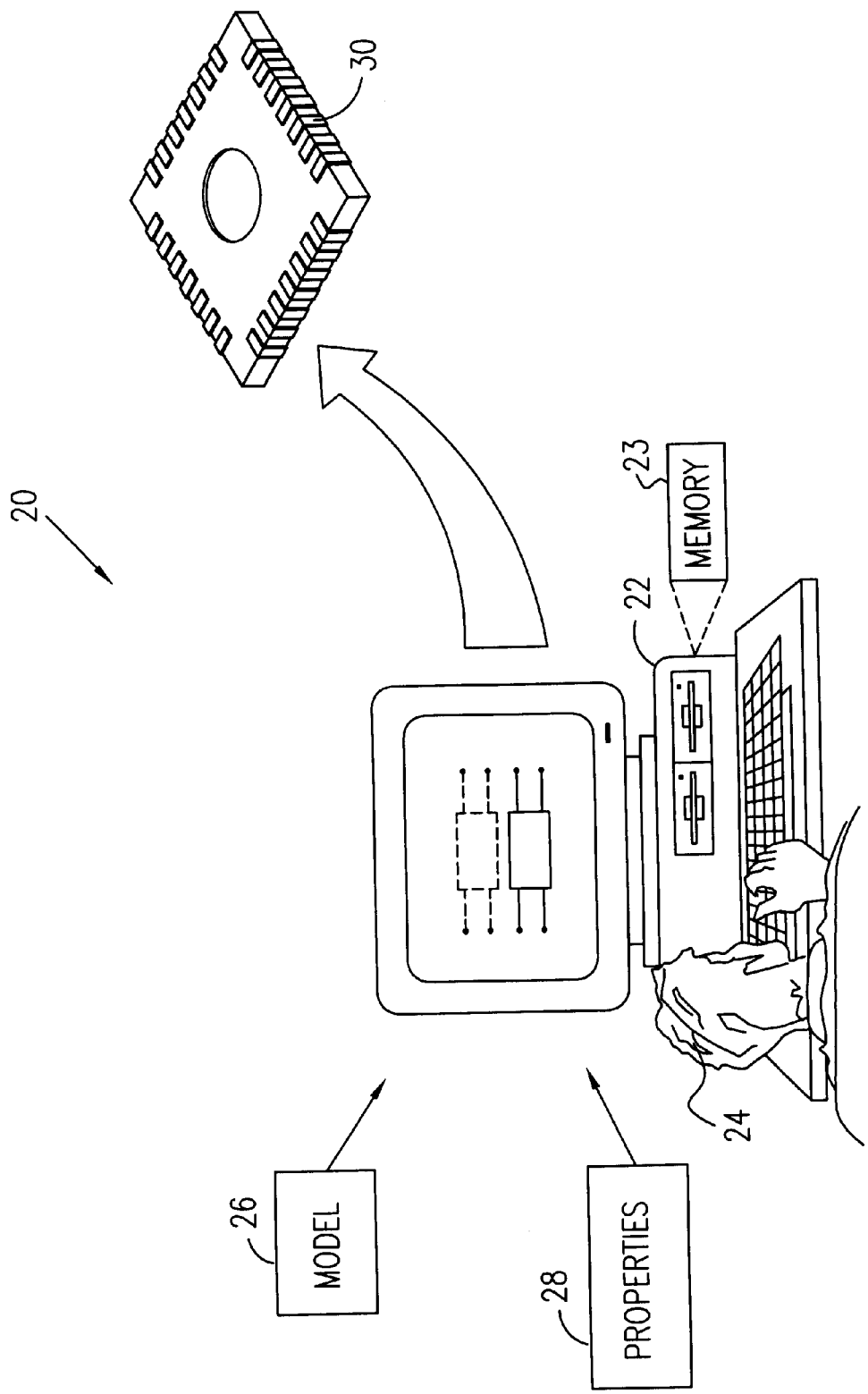
FIG. 1 is a schematic, pictorial illustration showing apparatus for model checking, in accordance with a preferred embodiment of the present invention.

FIG. 1 is a schematic pictorial illustration of a system 20 for symbolic model checking, in accordance with a preferred embodiment of the present invention. System 20 comprises a model processor 22 with a memory 23. Processor 22 typically comprises a general-purpose computer workstation running suitable model checking software, under the control of a user 24, generally a design or verification engineer. The model checking software may be downloaded to processor 22 in electronic form, over a network, for example, or it may be supplied on tangible media, such as CD-ROM or non-volatile memory.

Processor 22 receives a hardware implementation model 26 of a target system or device 30 in development, which may refer to the entire system or device or to a sub-unit, such as a circuit or functional block. User 24 prepares a specification of properties 28 for use in model checking of model 26, and selects initial and target states of the model. System 20 analyzes the model, using methods described in detail hereinbelow, to perform on-the-fly checking of model 26 against properties 28, and to construct counterexample traces when it finds that a property is violated.

The on-the-fly model checking procedure is shown formally in Table I below:

TABLE I

ON-THE-FLY MODEL CHECKING

| 1  | reachable = new = initialStates; |
| 2  | i = 0; |
| 3  | while ((new ≠ Ø) && (new ∩ error = Ø)) { |
| 4  |    $S_i$ = new; |
| 5  |    i = i+1; |
| 6  |    next = nextStateImage(new); |
| 7  |    new = next\reachable; |
| 8  |    reachable = reachable ∪ next; |
| 9  | } |
| 10 | if (new = Ø) { |
| 11 |    print "formula is true in the model"; |
| 12 |    return; |
| 13 | } |
| 14 | k = i; |
| 15 | print "formula is false in the model, failed at cycle k"; |
| 16 | bad = new ∩ error; |
| 17 | while (i≧0) { |
| 18 |    $X_i$ = choose one state from bad; |
| 19 |    if (i>0) bad = pred($X_i$) ∩ $S_{i-1}$; |
| 20 |    i = i−1; |
| 21 | } |
| 22 | print "counterexample is:" $X_0 \ldots X_k$; |

Here the "&&" operator represents logical conjunction.

As noted above, the process described in Table I above includes two main components: reachability analysis (lines 1–15) and counterexample construction (lines 16–22). In the reachability analysis, a set of successive reachable states $\{S_0, S_1, \ldots, S_n\}$, also referred to as "donuts," is constructed by iteration of the transition relation, such that each set is disjoint from the preceding one. At each iteration, the function "nextStateImage(new)" returns the states that are reached in one cycle of the system transition relation beginning from the states in {new}. This process terminates when the relevant state space is exhausted (line 10) or when one of the donuts is found to intersect the set of "error" target states, in which expression p is false (line 14).

In the latter case, the model checker constructs a counterexample trace, illustrating how the error state can be reached from one of the initial states. This process uses the donuts $S_0, S_1, \ldots, S_n$ defined at line 4 in the reachability analysis, iterating backward from one of the target states in the last donut, $S_n$, to one of the initial states. At each iteration in the process of counterexample construction, the function "pred($X_i$)" finds, for each "bad" state along the trace, a predecessor state in the preceding donut $S_{i-1}$ that would be mapped to the bad state by the image operation described above. The set of the predecessor states $X_0 \ldots X_k$ from one of the initial states to one of the target states constitutes a counterexample trace.

Typically, the donuts $S_0, S_1, \ldots, S_n$ are represented in the calculations made by processor 22 and are stored in memory 23 in the form of binary decision diagrams (BDDs), as are known in the art. The theory of BDDs is described, for example, by Bryant, in "Graph-based Algorithms for Boolean Function Manipulation," *IEEE Transactions on Computers* C-35:8 (1986), which is incorporated herein by reference. The use of BDDs in on-the-fly model checking is described in the above-mentioned U.S. patent application Ser. No. 10/042,304 entitled, "Efficient Production of Disjoint Multiple Traces," now U.S. Pat. No. 2002/0193974-A1. The principles of the present invention may also be implemented, however, using other methods and data structures known in the art for representing state variables. The present invention is in no way limited to the BDD-based methods described here.

The size of all the BDDs used and saved by processor 22 in a model checking run strongly influences the speed of calculations. If none of the BDDs are saved during the reachability analysis (lines 1–9 in Table I), this stage of the run can progress at maximal speed. If the formula is then found to be false, however, the BDDs must all be recomputed—essentially repeating the reachability analysis calculation—in order to find the counterexample (lines 14–21). On the other hand, if all the BDDs found in the reachability analysis are saved, the large data volume of the BDDs clogs memory 23 and may eventually overflow the available memory space. Furthermore, even BDDs that are not used in a given stage in the run must still be handled by garbage collection (to free unused memory) and BDD reordering routines at each stage, adding to the computational demands on processor 22. As a result, when checking large models, saving all the donuts in the reachability analysis state can cause the run to take an unacceptably long time to finish.

Figure 2:
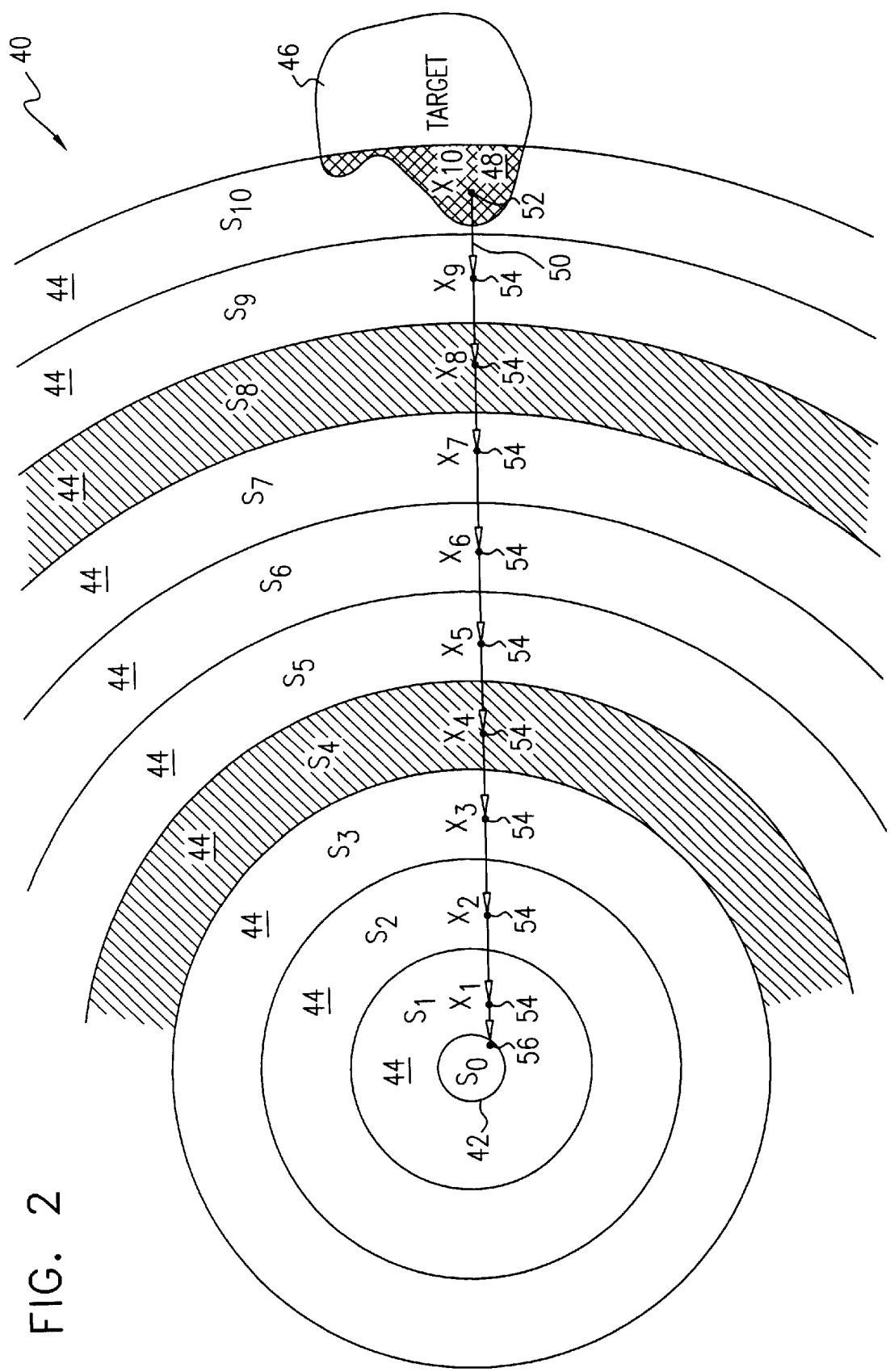
FIG. 2 is a schematic representation of a system state space, illustrating states found during reachability analysis of the system and used in counterexample production, in accordance with a preferred embodiment of the present invention.
Figure 3:
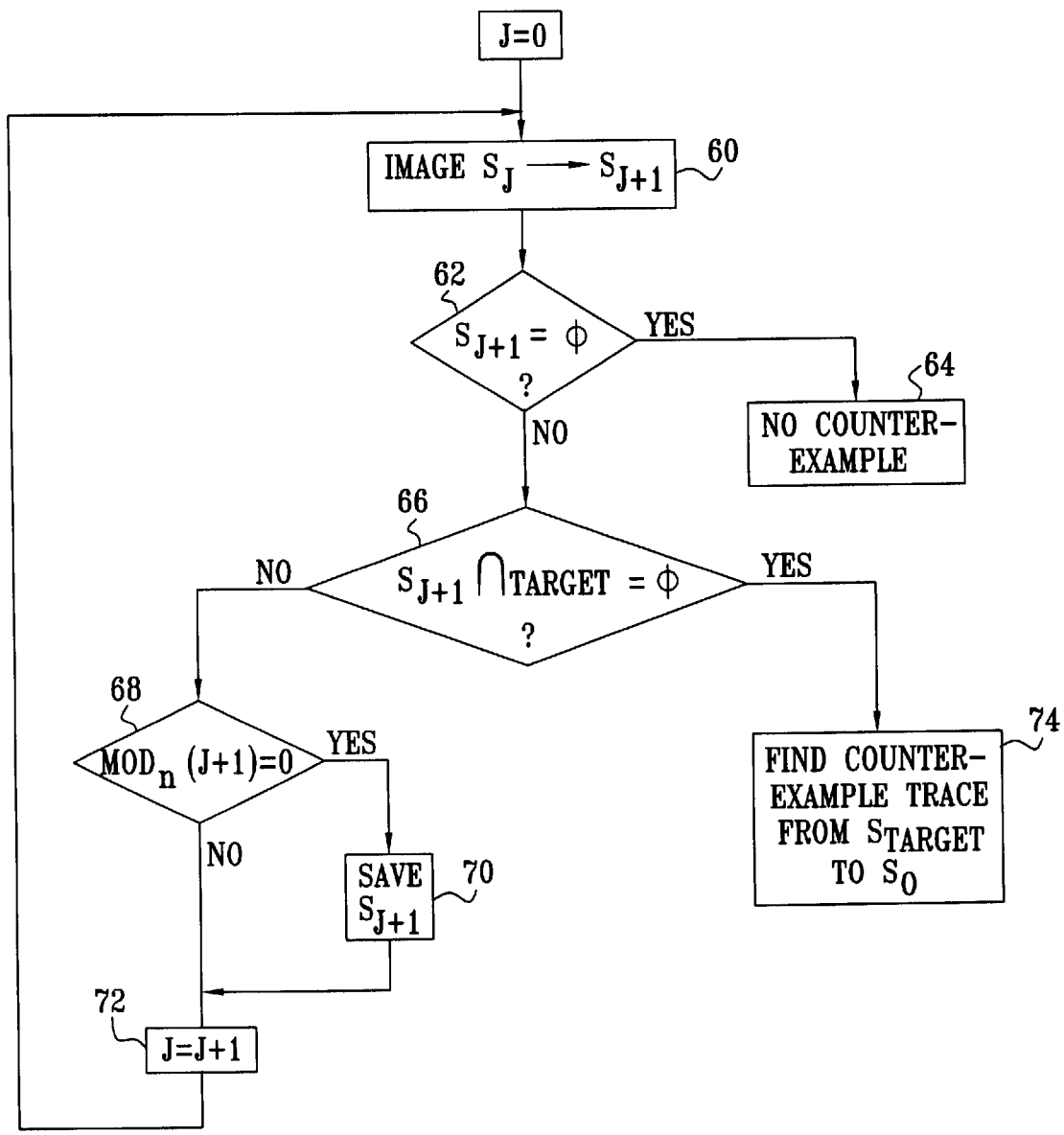
FIG. 3 is a flow chart that schematically illustrates a method for verifying a system using model checking, in accordance with a preferred embodiment of the present invention.

Reference is now made to FIGS. 2 and 3, which illustrate a method for on-the-fly model checking with reduced memory requirements, in accordance with a preferred embodiment of the present invention. This method avoids the problem of memory overflow described above, without requiring the processor to recompute all the donuts from scratch in order to find a counterexample. FIG. 2 is a schematic representation of a state space 40 of model 26, providing a conceptual view of the operation of the method. FIG. 3 is a flow chart that schematically illustrates the method itself. Reachability analysis of the state space begins from a set 42 of initial states, labeled $S_0$, which are typically specified by user 24. At an imaging step 60, processor 22 applies an image operation (using the nextStateImage( ) function at line 6 in Table I) to map $S_0$ into a "donut" 44 of states $S_1$. Subsequent iterations map each donut $S_J$ into a successive donut $S_{J+1}$. Referring back to Table I, at line 7, states reached previously are removed from the set included in the new donut, so that each donut is uniquely characterized by the minimal number J of iterations of the transition relation that are required to reach the states in the donut.

As each new donut 44 is computed, processor 22 checks to determine whether the entire reachable state space of the model has been explored, at a state exhaustion step 62. If the new donut is empty, indicating that there are no more states to reach, processor 22 reports that the formula AG(p) is true on model 56 (line 11 in Table I), and returns no counterexample traces, at a traceless return step 64. If the donut is non-empty, the processor checks the states in the donut against a definition of target states 46, at an intersection checking step 66 (corresponding to line 3 in Table I). As noted above, the target states are typically characterized by a predefined formula AG(p) (or ¬p) being false on these states.

As long as no intersection is found at step 66, processor 22 next decides whether the current donut is to be saved in memory 23, at a save determination step 68. Typically, one donut is saved out of every n donuts generated. In other words, if $\mod_n(J+1)=0$, then $S_{J+1}$ is saved, at a donut saving step 70. The remaining donuts are immediately discarded. In the example shown in FIG. 2, n=4, causing donuts $S_4$ and $S_8$ (marked by hatching) to be saved. The index J is then incremented, at an incrementing step 72. The processor iterates again through step 60 to find the next donut, and the process is repeated.

When an intersection region 48 is found at step 66 between target states 46 and one of donuts 44 ($S_{10}$ in the example of FIG. 2), the reachability analysis terminates. Processor 22 then proceeds to find a counterexample trace 50, at a trace production step 74. The trace is constructed beginning from a selected end state $X_{10}$ in the intersection region $S_{target}$, and proceeding backward through donuts 44 to a starting state $X_0$ in $S_0$. In the course of producing the trace, the saved donuts are used to reconstruct the donuts that were discarded, as described in detail hereinbelow.

Figure 4:
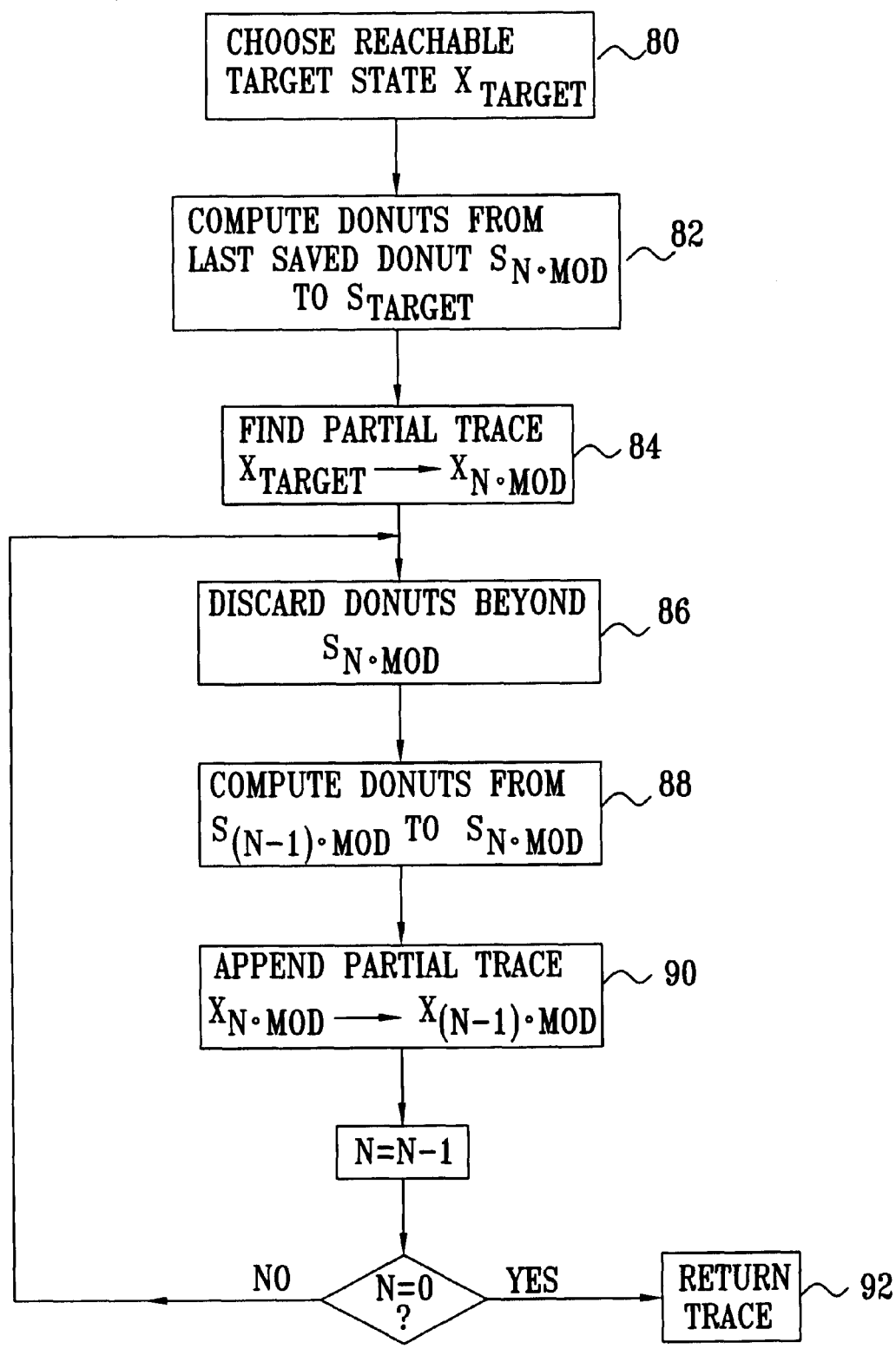
FIG. 4 is a flow chart that schematically illustrates a method for producing a counterexample, in accordance with a preferred embodiment of the present invention.

FIG. 4 is a flow chart that schematically shows details of trace production step 74, in accordance with a preferred embodiment of the present invention. The method of FIG. 4 is described here, by way of example, with reference to FIG. 2. To start the trace, a suitable target state 52 (referred to as $X_{target}$, and marked $X_{10}$ in FIG. 2) is chosen in the intersection region $S_{target}$, at a target selection step 80. The states in donuts $S_4$ and $S_8$ were saved during the reachability analysis, at step 70, but the remaining donuts were not. Therefore, at a final donut computation step 82, the donuts between the last saved donut (in this case $S_8$) and the final donut ($S_{10}$) containing the intersection region are reconstructed. In the present example, this means that donut $S_9$ is computed by applying the image operation of step 60 (line 6 in Table I) to $S_8$ (referred to as $S_{N^*MOD}$ in FIG. 4). Now the "pred" operation (line 19 in Table I) is applied to find predecessor states 54 to $X_{10}$ on trace 50 in donuts $S_8$ and $S_9$, at a first partial tracing step 84.

At this point, processor 22 has no further use for the donuts beyond $S_8$. It therefore discards these donuts from memory 23, at a donut discard step 86. Now the next portion of trace 50 are produced, by reconstructing the next group of donuts, at an intermediate donut computation step 88. As at step 82 above, donuts $S_5$, $S_6$ and $S_7$ are computed by successive applications of the image operation, beginning from $S_4$ ($S_{(N-1)^*MOD}$). The partial trace found at step 84 is extended by finding predecessor states 54 going back from $S_{N^*MOD}$ to $S_{(N-1)^*MOD}$, at an intermediate partial tracing step 90. The index N is then decremented, and steps 86–90 are repeated, discarding and reconstructing new groups of donuts in turn, until trace 50 reaches back to a final point 56 in $S_0$. Processor 22 then returns the counterexample trace to user 24 and is ready to begin the next model checking run.

Although the preferred embodiments described hereinabove make use of on-the-fly model checking (and are thus limited to testing formulas of the type AG(p)), the principles of the present invention may be applied to solve problems of memory explosion in state space analysis and counterexample production using other model checking paradigms, as well. It will thus be appreciated that the preferred embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

What is claimed is:

1. A method for checking a model, which defines states of a system under study and a transition relation among the states, the method comprising:

specifying a property that applies to a target set that comprises one or more target states among the states of the system under study;

beginning with an initial set of one or more initial states among the states of the system, computing a succession of sets of the states of the system, such that the states in each of the sets are reachable by a successive cycle of the transition relation from the states in a preceding set in the succession;

selecting one or more of the sets in the succession to be saved in a memory, while the sets not selected are discarded;

finding an intersection between one of the sets in the succession and the target set; and computing a trace from one of the target states in the intersection through the states in the sets in the succession, including the discarded sets, to one of the initial states, using the sets saved in the memory to reconstruct the discarded sets.

2. A method according to claim 1, wherein computing the succession of sets comprises:

determining a first set among the sets in the succession, disjoint from the initial set, such that all of the states in the first set are reached from the initial states in a first cycle of the transition relation; and determining the sets in the succession following the first set, such that all the states in each of the sets are reached from the states in the preceding set in the successive cycle of the transition relation, and so that each of the sets in the succession is disjoint from the initial set and from other sets determined before it.

3. A method according to claim 2, wherein computing the trace comprises selecting one of the states from each of the successive sets.

4. A method according to claim 3, wherein selecting the one of the states comprises, for each of the selected states, choosing a predecessor state among the states in the preceding set until the state on the trace in the first set is found, and choosing the predecessor state in the initial set to the state in the first set.

5. A method according to claim 1, wherein selecting the one or more of the sets to be saved comprises saving one of the sets in every N sets that are computed in the succession, wherein N is an integer parameter greater than one, and discarding the sets intermediate the saved sets.

6. A method according to claim 1, wherein computing the trace comprises:

reconstructing a first group of the discarded sets between an intermediate set among the selected sets and the intersection;

computing a first portion of the trace through the first group of the reconstructed sets;

discarding the first group of the reconstructed sets from the memory;

reconstructing a second group of the discarded sets preceding the intermediate set in the succession;

computing a second portion of the trace through the second group of the reconstructed sets; and appending the portions of the trace together so as to complete the trace.

7. A method according to claim 6, wherein reconstructing the first group comprises computing the sets in the first group by repeating the step of computing the succession of the sets, starting from the intermediate set.

8. A method according to claim 6, wherein the second group of the discarded sets comprises the discarded sets between a further set among the selected sets, prior to the intermediate set in the succession, and wherein reconstructing the second group comprises reconstructing the discarded sets between the further set and the intermediate set in the succession, and comprising repeating the steps of discarding the reconstructed sets, reconstructing the discarded sets and computing and appending the portions of the trace until the trace reaches one of the initial states.

9. A method according to claim 1, wherein specifying the property comprises specifying a condition that is expected to be true over all of the reachable states of the system under study, and wherein the condition is false at least in the one target state.

10. A method according to claim 1, wherein specifying the property comprises specifying a condition representing a desired behavior of the system under study, such that the condition is fulfilled at least in the one target state.

11. A method according to claim 1, wherein computing the successive reachable sets comprises testing the property while computing the sets, and ceasing to compute the sets when the intersection is found.

12. A method according to claim 1, wherein computing the trace comprises finding a counterexample to the specified property.

13. Apparatus for checking a model, which defines states of a system under study and a transition relation among the states, the apparatus comprising:

a memory, adapted to store data; and a model processor, which is arranged to receive a property that applies to a target set that comprises one or more target states among the states of the system under study, and to compute, beginning with an initial set of one or more initial states among the states of the system, a succession of sets of the states of the system, such that the states in each of the sets are reachable by a successive cycle of the transition relation from the states in a preceding set in the succession, such that while computing the sets, the processor selects one or more of the sets in the succession to be saved in the memory, while the sets not selected are discarded, the processor being further arranged to find an intersection between one of the sets in the succession and the target set, and to compute a trace from one of the target states in the intersection through the states in the sets in the succession, including the discarded sets, to one of the initial states, using the sets saved in the memory to reconstruct the discarded sets.

14. Apparatus according to claim 13, wherein the processor is further arranged to determine a first set among the sets in the succession, disjoint from the initial set, such that all of the states in the first set are reached from the initial states in a first cycle of the transition relation, and to determine the sets in the succession following the first set, such that all the states in each of the sets are reached from the states in the preceding set in the successive cycle of the transition relation, and so that each of the sets in the succession is disjoint from the initial set and from other sets determined before it.

15. Apparatus according to claim 14, wherein in computing the trace, the processor selects one of the states from each of the successive sets.

16. Apparatus according to claim 15, wherein the processor selects the one of the states by choosing, for each of the selected states, a predecessor state among the states in the preceding set until the state on the trace in the first set is found, and then choosing the predecessor state in the initial set to the state in the first set.

17. Apparatus according to claim 13, wherein the processor is further arranged to save one of the sets in every N sets that are computed in the succession, wherein N is an integer parameter greater than one, and to discard the sets intermediate the saved sets.

18. Apparatus according to claim 13, wherein the processor is further arranged to compute the trace by reconstructing a first group of the discarded sets between an intermediate set among the selected sets and the intersection, computing a first portion of the trace through the first group of the reconstructed sets, and discarding the first group of the reconstructed sets from the memory, and then by reconstructing a second group of the discarded sets preceding the intermediate set in the succession, computing a second portion of the trace through the second group of the reconstructed sets, and appending the portions of the trace together so as to complete the trace.

19. Apparatus according to claim 18, wherein the processor is further arranged to reconstruct the first group by computing again, starting from the intermediate set, the succession of sets of the states of the system, such that the states in each of the sets are reachable by a successive cycle of the transition relation from the states in a preceding set in the succession.

20. Apparatus according to claim 18, wherein the second group of the discarded sets comprises the discarded sets between a further set among the selected sets, prior to the intermediate set in the succession, and wherein reconstructing the second group comprises reconstructing the discarded sets between the further set and the intermediate set in the succession, and wherein the processor is arranged to repeat the steps of discarding the reconstructed sets, reconstructing the discarded sets and computing and appending the portions of the trace until the trace reaches one of the initial states.

21. Apparatus according to claim 13, wherein the property comprises a condition that is expected to be true over all of the reachable states of the system under study, and wherein the condition is false at least in the one target state.

22. Apparatus according to claim 13, wherein the property comprises a condition representing a desired behavior of the system under study, such that the condition is fulfilled at least in the one target state.

23. Apparatus according to claim 13, wherein the processor is further arranged to test the property while computing the successive reachable sets, and to cease to compute the sets when the intersection is found.

24. Apparatus according to claim 13, wherein the trace corresponds to a counterexample to the received property.

25. A computer software product for checking a model, which defines states of a system under study and a transition relation among the states, the product comprising a computer-readable medium in which program instructions are stored, which instructions, when read by a computer, cause the computer to receive a property that applies to a target set that comprises one or more target states among the states of the system under study, and to compute, beginning with an initial set of one or more initial states among the states of the system, a succession of sets of the states of the system, such that the states in each of the sets are reachable by a successive cycle of the transition relation from the states in a preceding set in the succession, such that while computing the sets, the computer selects one or more of the sets in the succession to be saved in the memory, while the sets not selected are discarded, the instructions further causing the computer to find an intersection between one of the sets in the succession and the target set, and to compute a trace from one of the target states in the intersection through the states in the sets in the succession, including the discarded sets, to one of the initial states, using the sets saved in the memory to reconstruct the discarded sets.

26. A product according to claim 25, wherein the instructions further cause the computer to determine a first set among the sets in the succession, disjoint from the initial set, such that all of the states in the first set are reached from the initial states in a first cycle of the transition relation, and to determine the sets in the succession following the first set, such that all the states in each of the sets are reached from the states in the preceding set in the successive cycle of the transition relation, and so that each of the sets in the succession is disjoint from the initial set and from other sets determined before it.

27. A product according to claim 26, wherein the instructions further cause the computer, in computing the trace, to select one of the states from each of the successive sets.

28. A product according to claim 27, wherein the instructions further cause the computer to select the one of the states by choosing, for each of the selected states, a predecessor state among the states in the preceding set until the state on the trace in the first set is found, and then choosing the predecessor state in the initial set to the state in the first set.

29. A product according to claim 25, wherein the instructions further cause the computer to save one of the sets in every N sets that are computed in the succession, wherein N is an integer parameter greater than one, and to discard the sets intermediate the saved sets.

30. A product according to claim 25, wherein the instructions further cause the computer to compute the trace by reconstructing a first group of the discarded sets between an intermediate set among the selected sets and the intersection, computing a first portion of the trace through the first group of the reconstructed sets, and discarding the first group of the reconstructed sets from the memory, and then by reconstructing a second group of the discarded sets preceding the intermediate set in the succession, computing a second portion of the trace through the second group of the reconstructed sets, and appending the portions of the trace together so as to complete the trace.

31. A product according to claim 30, wherein the instructions further cause the computer to reconstruct the first group by computing again, starting from the intermediate set, the succession of sets of the states of the system, such that the states in each of the sets are reachable by a successive cycle of the transition relation from the states in a preceding set in the succession.

32. A product according to claim 30, wherein the second group of the discarded sets comprises the discarded sets between a further set among the selected sets, prior to the intermediate set in the succession, and wherein reconstructing the second group comprises reconstructing the discarded sets between the further set and the intermediate set in the succession, and wherein the instructions further cause the computer to repeat discarding the reconstructed sets, reconstructing the discarded sets and computing and appending the portions of the trace until the trace reaches one of the initial states.

33. A product according to claim 25, wherein the property comprises a condition that is expected to be true over all of the reachable states of the system under study, and wherein the condition is false at least in the one target state.

34. A product according to claim 25, wherein the property comprises a condition representing a desired behavior of the system under study, such that the condition is fulfilled at least in the one target state.

35. A product according to claim 25, wherein the instructions cause the computer to test the property while computing the successive reachable sets, and to cease to compute the sets when the intersection is found.

36. A product according to claim 25, wherein the trace corresponds to a counterexample to the received property.

* * * * *